(12) United States Patent
Brennfleck et al.

(10) Patent No.: US 11,932,937 B2
(45) Date of Patent: Mar. 19, 2024

(54) COATED PRODUCT AND PRODUCTION METHOD

(71) Applicant: SCHUNK KOHLENSTOFFTECHNIK GMBH, Heuchelheim (DE)

(72) Inventors: Karl Brennfleck, Karlsruhe (DE); Johannes Galle, Hundsangen (DE); Dennis Muscutt, Lollar (DE); Volker Rauhut, Buseck (DE)

(73) Assignee: SCHUNK KOHLENSTOFFTECHNIK GMBH, Heuchelheim (DE)

( * ) Notice: Subject to any disclaimer, the term of this patent is extended or adjusted under 35 U.S.C. 154(b) by 658 days.

(21) Appl. No.: 16/489,632

(22) PCT Filed: Mar. 1, 2018

(86) PCT No.: PCT/EP2018/055020
§ 371 (c)(1),
(2) Date: Aug. 28, 2019

(87) PCT Pub. No.: WO2018/166802
PCT Pub. Date: Sep. 20, 2018

(65) Prior Publication Data
US 2020/0024732 A1    Jan. 23, 2020

(30) Foreign Application Priority Data
Mar. 14, 2017  (DE) .................... 10 2017 204 257.5

(51) Int. Cl.
*C23C 16/34* (2006.01)
*C23C 16/02* (2006.01)
*C23C 16/04* (2006.01)
*C23C 16/46* (2006.01)

(52) U.S. Cl.
CPC ........ *C23C 16/345* (2013.01); *C23C 16/0272* (2013.01); *C23C 16/045* (2013.01); *C23C 16/46* (2013.01)

(58) Field of Classification Search
None
See application file for complete search history.

(56) References Cited

U.S. PATENT DOCUMENTS

| | | | | |
|---|---|---|---|---|
| 4,239,819 A | * | 12/1980 | Holzl | C04B 41/009 148/278 |
| 4,580,524 A | * | 4/1986 | Lackey, Jr. | C04B 35/5626 118/725 |
| 4,741,925 A | | 5/1988 | Chaudhuri et al. | |
| 5,283,089 A | | 2/1994 | Bates | |
| 5,286,565 A | * | 2/1994 | Holzl | C04B 41/5057 427/249.15 |
| 5,300,322 A | * | 4/1994 | Lowden | C23C 16/345 427/255.17 |
| 6,284,357 B1 | | 9/2001 | Lackey et al. | |
| 2017/0016113 A1 | * | 1/2017 | Thompson | C07F 5/062 |
| 2017/0096345 A1 | * | 4/2017 | Shero | C23C 16/45525 |

FOREIGN PATENT DOCUMENTS

| | | |
|---|---|---|
| AU | 664824 B1 | 12/1995 |
| CN | 101454880 A | 6/2009 |
| CN | 101555014 A | 10/2009 |
| CN | 102221293 A | 10/2011 |
| CN | 102515851 A | 6/2012 |
| CN | 102859049 A | 1/2013 |
| CN | 103058696 A | 4/2013 |
| DE | 3933039 A1 | 4/1991 |
| DE | 69630484 T2 | 8/2004 |
| JP | H05263255 A | 10/1993 |
| JP | 5296999 A | 9/2000 |
| JP | 2014523638 A | 9/2014 |
| WO | 9412448 A1 | 6/1994 |

OTHER PUBLICATIONS

Ghanem, Hanadi, et al., "Processing of biomorphic Si3N4 ceramics by CVI-R technique with SiCl4/H2/N2 system" Journal of the European Ceramic Society 27 (2007) 2119-2125, Department of Chemical Reaction Engineering, University Erlangen-Nuremberg Egerlandstrasse 3, D-91058 Erlangen, Germany.
English machine translation of DE3933039.
English machine translation of DE69630484.
English machine translation of JPH05263255.
Chemical vapor deposition and infiltration processes of carbonmaterials; Carbon 40 (2002) 641-657; Centre de Recherche Paul Pascal (CNRS and University of Bordeaux 1), Avenue Albert Schweitzer, F-33600 Pessac Cedex, France; accepted Jul. 4, 2001.

* cited by examiner

*Primary Examiner* — David P Turocy
(74) *Attorney, Agent, or Firm* — Dickinson Wright PLLC; Andrew D. Dorisio

(57) ABSTRACT

The invention relates to a method for producing a product, to a crucible and to the use of a layer of crystalline silicon nitride, the product being formed from a material consisting mainly of carbon or of a ceramic material, the product being coated with surface layer by chemical vapor deposition (CVD), wherein the product is coated with a surface layer of at least semi-crystalline, preferably crystalline silicon nitride ($Si_3N_4$), the surface layer being formed on the product at a process temperature of more than 1100° C. to 1700° C.

1 Claim, No Drawings

COATED PRODUCT AND PRODUCTION METHOD

FIELD OF THE INVENTION

The invention relates to a crucible and to a method for producing a product, in particular a body, the product being formed from a material consisting mainly of carbon or of a ceramic material, the product being coated with a surface layer by chemical vapor deposition (CVD).

BACKGROUND OF THE INVENTION

Products coated by chemical vapor deposition are sufficiently known and are used in various fields of application. For instance, it is known for crucibles made of carbon, such as CFC or graphite, or of a ceramic material, such as quartz, to be coated with a surface layer of amorphous carbon or synthetic diamond by chemical vapor deposition (CVD). Furthermore, it is known in the field of the electrical industry or semi-conductor technology for substrates made of ceramic materials to be coated with silicon nitride. A surface layer of silicon nitride is typically formed by plasma-enhanced chemical vapor deposition (PECVD) with the purpose of passivating the substrate, for example. An amorphous surface layer of silicon nitride can be formed at a working temperature of 200° C. to 500° C. at a working pressure of 1 mbar using the PECVD method. This silicon nitride layer will still contain 5 to 30% hydrogen or oxygen from the process gas. Alternatively, it is also possible for silicon nitride layers to be applied to suitable bodies by what is known as slip casting, powder coating or flame and plasma spraying. Silicon nitride layers of this kind allow diffusion and are not gas-tight, not corrosion-resistant and/or contain hydrogen, oxygen, carbon or other impurities due to production.

Depending on the type of body coated with silicon nitride, however, it may be undesirable for the silicon nitride layer to not be corrosion-resistant or to have impurities. Furthermore, silicon nitride layers of this kind may wear quickly if they form a wetting surface of a crucible, for example. In this case, there is also the possibility that impurities contained in the silicon nitride layer might leak into a melt in the crucible and reduce the quality of the melt, which is why crucibles are preferably coated with other materials.

Hence, the object of the present invention is to provide a method for producing a product and to provide a crucible that have improved process properties.

This object is attained by a method having the features of claim 1, by a crucible having the features of claim 19 and by a use of a layer of crystalline silicon nitride having the features of claim 20.

DESCRIPTION OF THE INVENTION

In the method according to the invention for producing a product, in particular a body, the product is formed from a material consisting mainly of carbon or of a ceramic material, the product being coated with a surface layer by chemical vapor deposition (CVD), wherein the product is coated with a surface layer of at least semi-crystalline, preferably crystalline silicon nitride ($Si_3N_4$), the surface layer being formed on the product at a process temperature of more than 1100° C. to 1700° C., preferably more than 1200° C. to 1550° C., in particular more than 1300° C. to 1500° C.

Since the method according to the invention is performed in particular in the process temperature range indicated above, it becomes possible for the surface layer on the product or on the one-piece body to be formed from at least semi-crystalline silicon nitride. The product is heated in a high-temperature installation and a metered amount of gas is added. Said gas contains at least one compound containing silicon and one compound containing nitrogen. By absorption of the gas molecules on a surface of the product and by a chemical reaction, the surface layer consisting of substantially semi-crystalline silicon nitride is deposited on the surface of the product. Depending on the selected process temperature, preferably crystalline silicon nitride can be deposited on the surface of the product. The surface layer of at least semi-crystalline silicon nitride already has fewer impurities than a surface layer produced by a LPCVD or PECVD method. Moreover, the surface layer produced by the method according to the invention is more corrosion-resistant and exhibits advantageous wetting behavior with respect to metal melts or silicon melts, for example. For instance, crucibles consisting of carbon or of a ceramic material can then be coated with the surface layer, the crucibles thus having a longer lifetime and the probability of pollution of a melt due to impurities present in the surface layer being substantially reduced. In principle, the method according to the invention also allows any type of product made of carbon or of a ceramic material to be coated with a surface layer of at least semi-crystalline silicon nitride, in particular if advantageous product properties can be achieved by applying the surface layer to the product in question, such as in the field of high-temperature applications.

The surface layer can be formed from stoichiometric crystalline silicon nitride. In this way, the surface layer can be formed from pure crystalline silicon nitride without starting materials or reactants of the materials used in the method remaining in the surface layer.

This is also how the crystalline silicon nitride can be formed substantially free of carbon, hydrogen and/or metals. The surface layer will be substantially free of impurities that might diffuse out of the surface layer during high-temperature application of the product, for example. The surface layer can also be applied to a crucible as a product that is used to produce high-purity silicon products.

The crystalline silicon nitride can be formed in the modifications trigonal ($\alpha$-$Si_3N_4$), hexagonal ($\beta$-$Si_3N_4$) and/or cubic ($\gamma$-$Si_3N_4$). The modifications can be produced by adjusting process parameters. In doing so, a proportion of certain crystal faces can be influenced as well, which, in turn, has an impact on the physical properties of the surface layer. Overall, the morphology of the surface layer can thus be influenced by the formation of the different silicon nitride crystals of the surface layer. For instance, the silicon nitride crystals can be pyramidal or spherical, which affects the physical behavior of the surface layer in relation to other materials. For example, wettability of the surface layer can be influenced and, if applicable, a so-called lotus effect between the surface layer and a silicon melt can be achieved in this way, pollution of the silicon melt thus being precluded and a lifetime of the product in question being prolonged. Moreover, improved corrosion resistance of the surface layer can be achieved by forming the modification.

The surface layer of the product can be formed with a layer thickness of 1 µm to 5000 µm, preferably 1 µm to 1000 µm, and in particular 5 µm to 100 µm. The layer thickness can be formed as a function of the physical properties required of the product, for example. For instance, the surface layer can be formed in such a manner that it acts as a diffusion barrier.

It is advantageous if the surface layer is formed on the product at a pressure of >1 mbar to 300 mbar, preferably >1 mbar to 60 mbar, in a process chamber. Formation of crystalline silicon nitride, i.e. chemical vapor deposition, is significantly simplified in this way.

In an embodiment of the method, during chemical vapor deposition, the product can be heated to process temperature in a process chamber and a metered amount of a gas mixture comprising at least one compound containing silicon and one compound containing nitrogen can be fed into the process chamber, allowing the surface layer of crystalline silicon nitride to be deposited on the product.

In particular, the gas mixture can be formed within a process-gas nozzle in the process chamber. In this way, a reaction of the respective process gases outside of the process chamber can be avoided. For example, a gas mixture containing silane and a gas mixture containing nitrogen can be fed into the process chamber separately, in which case the two gas mixtures cannot be mixed with each other in the process chamber before reaching the process-gas nozzle. Forming the gas mixture in the process chamber and not before helps form a particularly pure surface layer of crystalline silicon nitride. In particular, it can be ensured that the gases in question react at the desired process parameters, i.e. at the process parameters required for forming the surface layer.

In another embodiment of the method, during chemical vapor deposition, the product can be heated to process temperature in a process chamber and a metered amount of gas comprising at least one compound containing silicon can be fed into the process chamber, allowing a surface layer of silicon to be deposited on the product, wherein subsequently a metered amount of gas comprising at least one compound containing nitrogen can be fed into the process chamber, allowing the silicon of the surface layer to be converted to crystalline silicon nitride. Consequently, the method can be performed in two stages, namely by forming the surface layer as a silicon layer, wherein the silicon layer can be formed with a layer thickness and a crystal structure that already correspond to the ultimately desired surface layer by adjusting the process parameters. After formation of the layer of silicon, the silicon layer can be converted to silicon nitride by supplying a gas containing nitrogen and by a chemical reaction of the silicon layer with the nitrogen from the vapor phase. Consequently by means of the further method step, the silicon layer can be nitrided and converted to the surface layer of crystalline silicon nitride. For example, a multilayer coating can then also be formed on the product, a diffusion layer of crystalline silicon nitride, which forms the surface layer, being formed on a silicon layer deposited on the product.

The gas comprising the compound containing silicon can also be fed into the process chamber during or after formation of the surface layer of silicon. In this way, the next process step can be started even prior to ultimate formation of the layer of silicon on the product in the course of a first process step, allowing a multilayer coating to also be obtained. However, it is also possible for the process steps to be performed completely separately from each other and, if applicable, to obtain a one-layer or multi-layer coating or surface layer in this way, too.

It is particularly advantageous if the compound containing silicon and the compound containing nitrogen are fed into the process chamber at a ratio of 1:20, preferably 1:2, in particular 1:1. For example, trigonal silicon nitride modifications can be obtained with a composition of the compound containing silicon and the compound containing nitrogen at a ratio of <1:20, in particular 1:2 or 1:1. With a composition at a ratio of >1:20, mixtures of a trigonal and a hexagonal modification can also be produced. Furthermore, it was shown that with increasing temperature, a size of the crystals can increase as well. The trigonal silicon nitride modification in particular can be produced at a process temperature of 1300° C. to 1500° C. Thus, it is possible to specifically influence a silicon nitride modification in the surface layer and thus the physical properties of the surface layer with the method.

It may further be provided for the process chamber to be heated by a resistance heater or inductively. Heating by means of microwaves, infrared or formation of plasma is not necessary in this case. The resistance heater may merely serve to establish the process temperature in the process chamber or at the product to be coated. Carrying out the method becomes significantly more cost-effective in this way.

Ammonia and/or nitrogen can be used as a compound containing nitrogen, and silane, preferably monosilane, disilane, trisilane, dichlorosilane, tetrachlorosilane and/or trichlorosilane can be used as a compound containing silicon. It is also possible to influence a crystal shape by changing a silane/nitrogen ratio while the modification stays the same so as to obtain a texture or preferred orientation within the surface layer, for example.

Optionally, hydrogen, hydrogen chloride and argon can be used as another gas. These gases can be mixed with the compound containing nitrogen and/or the compound containing silicon or can be added to the process chamber separately.

Prior to formation of the surface layer, the product can be infiltrated with at least semi-crystalline, preferably crystalline silicon nitride. This is possible if the product or its material comprises a material of a porosity that allows the material to be infiltrated by chemical vapor infiltration (CVI), for example. In this way, the surface layer can be bonded particularly tightly to the material of the product. Undesired detachment of the surface layer from the product can be prevented in this way.

The product can be infiltrated by chemical vapor infiltration (CVI) at a process temperature of more than 800° C. to 1700° C., preferably more than 1000° C. to 1550° C., in particular more than 1300° C. to 1500° C. At these process temperatures, deposition of at least semi-crystalline silicon nitride is guaranteed.

The product can be infiltrated or an infiltration layer can be formed prior to formation of the surface layer or in the course of the formation of the surface layer.

During infiltration of the product, pores in the material of the product can be closed or filled with the crystalline silicon nitride. The crystalline silicon nitride can completely fill the pores of the material of the product in the area of the surface of the product and thus inseparably bond the surface layer to the product.

It may further be provided for the product to be completely infiltrated during infiltration of the product with the crystalline silicon nitride or for an infiltration layer with a layer thickness of up to 100 µm, preferably of up to 500 µm, and in particular of up to 2.500 µm to be formed. Depending on the shape or material thickness of the product, the product can also be completely infiltrated, the product having only little or no porosity thereafter. Depending on the application of the product, it may also be advantageous for the product to not be completely infiltrated and for an infiltration layer having a layer thickness adapted to the specific application to be formed. The surface layer can then be formed on the infiltration layer. In case of potential mechanical stresses in the course of a high-temperature application as a function of the material of the product, fracturing of the surface layer due to stresses can be prevented by selecting a suitable layer thickness of the infiltration layer.

The crucible according to the invention, in particular for receiving metal melts or silicon melts, is made of graphite, carbon-fiber-reinforced carbon (CFC) or a ceramic material, at least a wetting surface of a melt receptacle of the crucible being coated with a surface layer of crystalline silicon nitride. The term wetting surface refers to a surface that comes into contact with a melt when the crucible is used as intended. The entire material of the crucible or merely areas thereof can be coated with the surface layer. Regarding the advantages of the crucible according to the invention, reference is made to the description of advantages of the method according to the invention. Other embodiments of a crucible are apparent from the features of the dependent claims referring to method claim 1.

According to the invention, a layer of crystalline silicon nitride is used as a surface layer for forming a wetting surface of a melt receptacle of a crucible made of graphite, carbon-fiber-reinforced carbon (CFC) or a ceramic material, in particular for receiving metal melts or silicon melts. Other advantageous embodiments of a use of the layer of crystalline silicon nitride are apparent from the features of the dependent claims referring to method claim 1.

The invention claimed is:

1. A method for producing a product, in particular a body, the product being formed from a material consisting essentially of carbon or of a ceramic material, the product being coated with a surface layer by chemical vapor deposition (CVD), comprising coating the product with a surface layer of at least semi-crystalline-silicon nitride ($Si_3N_4$), the surface layer being formed on the product at a process temperature of more than 1100° C. to 1700° C., wherein, prior to formation of the surface layer, the product is infiltrated with the at least semi-crystalline silicon nitride ($Si_3N_4$) by chemical vapor infiltration (CVI) at the process temperature of more than 800° C. to 1700° C., wherein the surface layer is formed from stoichiometric crystalline silicon nitride, and the crystalline silicon nitride is formed free of carbon, hydrogen, oxygen, and metals;

characterized in that during chemical vapor deposition, the product is heated to process temperature in a process chamber and a metered amount of a gas mixture comprising at least one compound containing silicon and one compound containing nitrogen is fed into the process chamber, the surface layer of crystalline silicon nitride being deposited on the product; and characterized in that the gas mixture is formed within a process-gas nozzle in the process chamber, and wherein gases forming the gas mixture are not mixed before they reach the nozzle.

* * * * *